United States Patent [19]

Bobeck et al.

[11] 4,056,814

[45] Nov. 1, 1977

[54] MAGNETORESISTIVE ELEMENT FOR DETECTING MAGNETIC BUBBLES

[75] Inventors: Andrew Henry Bobeck, Chatham; Henry Evelyn Derrick Scovil, Gladstone, both of N.J.

[73] Assignee: Bell Telephone Laboratories, Incorporated, Murray Hill, N.J.

[21] Appl. No.: 665,421

[22] Filed: Mar. 10, 1976

[51] Int. Cl.² ............................................. G11C 19/08
[52] U.S. Cl. .................................... 365/8 TF; 365/43
[58] Field of Search .................................. 340/174 TF

[56] References Cited

U.S. PATENT DOCUMENTS 3,713,117   1/1973   Bobeck ........................... 340/174 TF

OTHER PUBLICATIONS

IEEE Transactions on Magnetics - vol. mag.-9; No. 3, Sept. 1973, pp. 474–480.

Primary Examiner—James W. Moffitt
Attorney, Agent, or Firm—Herbert M. Shapiro

[57] ABSTRACT

The chevron elements of a detector stage of a magnetic bubble memory are interconnected in a manner to allow tailoring of the output signals produced in response to the presence of an elongated bubble. The tailoring is shown to allow a design which is characterized by an improved signal-to-noise ratio.

2 Claims, 8 Drawing Figures

MAGNETORESISTIVE ELEMENT FOR DETECTING MAGNETIC BUBBLES

FIELD OF THE INVENTION

This invention relates to magnetic bubble memories and more particularly to arrangements for detecting bubbles in such memories.

BACKGROUND OF THE INVENTION

Magnetic bubble memories are well known in the art. The most familiar type of bubble memory is referred to as the "field-access" type because a uniform magnetic field reorienting in the plane of bubble movement causes the bubbles to pass a detector sequentially. Such a field-access memory is characterized by a pattern of magnetically soft elements which defines paths for bubble movement in response to the reorienting in-plane field, as is well known.

The magnetically soft elements also typically define an expansion detector arrangement to which magnetic bubbles are moved. The detector arrangement includes consecutive columns of chevron elements, succeeding ones of which typically include greater numbers of elements. The detector stage is defined by the column with the greatest number of elements. The elements of the detector stage are interconnected to define a magnetoresistive element responsive to the presence of an elongated bubble to generate an output signal. Detection elements of this type are described in A. H. Bobeck U.S. Pat. No. 3,810,132, issued May 7, 1974.

BRIEF DESCRIPTION OF THE INVENTION

The present invention is based on the recognition that the geometry and placement of the interconnections between the chevron elements of a detector can be tailored for reducing noise. That is to say, (for example,) one-third of the elements, for example, may be connected by a set of interlinking elements at their ends, another third may be connected by a second set halfway between the ends and the apices of the chevron elements, and the last third may be connected by a third set at the apices. Each position for the interlinking elements produces a characteristic output signal, the three outputs being superposed to generate a tailored signal. Of course, more than three sets of interconnections can be employed in any given detector. In the limit, each pair of elements can have a uniquely positioned interconnection therebetween. No increase in cost results because only programming changes with respect to the production of the mask for the photolithographic work need be carried out.

DETAILED DESCRIPTION

Figure 1:
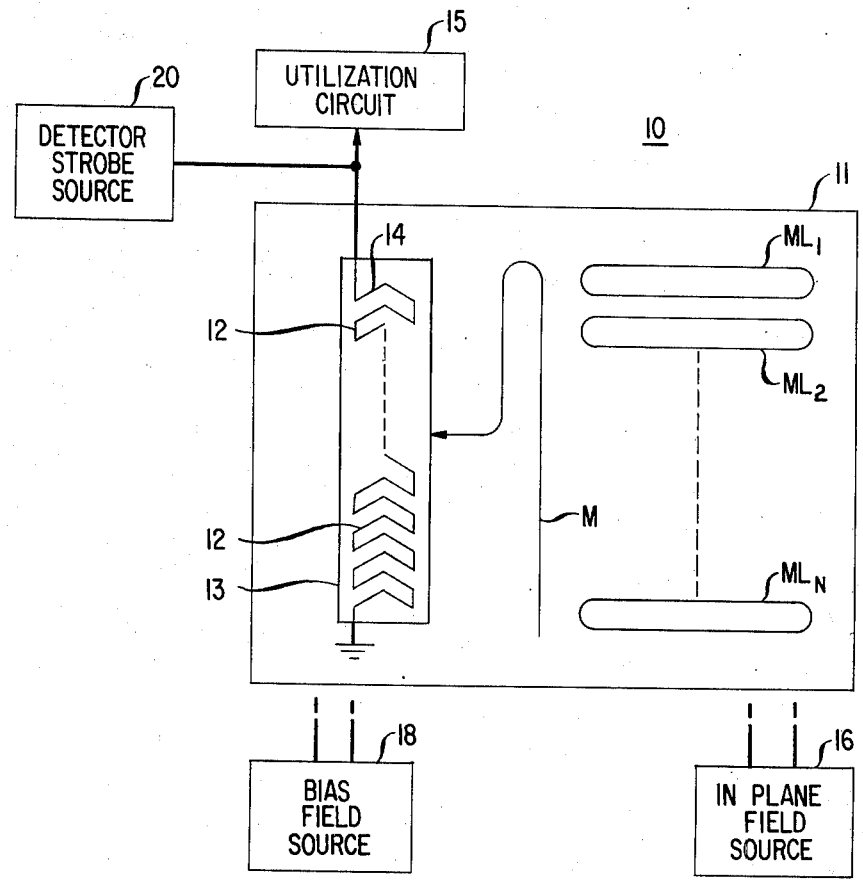
FIG. 1 is a schematic representation of a portion of a magnetic bubble memory.

FIG. 1 shows a magnetic bubble memory 10 comprising a layer of material 11 in which magnetic bubbles can be moved. The bubbles move along paths defined by a pattern of magnetic elements 12 (typically magnetically soft permalloy). The paths are represented by curves $ML_1$ to $ML_N$, representing closed propagation loops. Bubble patterns, representative of information, are moved in the closed loops and transferred, or replicated, into a similarly defined accessing path M, in a well-known manner, for movement to expansion detector arrangement 13. Arrangement 13 includes a detector stage comprising a column of chevron elements interconnected to form a magnetoresistive detector 14 shown in alternative illustrative forms in FIGS. 2A, 3A, and 4A. Information in the accessing path moves synchronously with the information in the loops, in response to the rotating field, and advances to the detector stage to produce signals representative of the information at the magnetoresistive detector. The detector applies the signals to a utilization circuit represented by block 15 in FIG. 1.

The rotating field is supplied by a source represented by block 16. Stable bubble operation occurs in the presence of a bias field directed antiparallel to the direction of the magnetization of a bubble. A bubble is moved typically in an epitaxially grown film having its magnetization normal to the plane of the film. Thus, the magnetization of the bubble is normal to that plane and the bias field is directed also normal to that plane. A bias field source is represented by block 18 in FIG. 1.

The storage of bubble patterns, representative of information, in a bubble memory is well understood in the art. Accordingly, a discussion of the means for storing such patterns is omitted here. Suffice it to say that means (not shown) is provided for storing such patterns and is operative in synchronism with the in-plane field for providing data for movement (from and) to path M of FIG. 1.

Figure 2A:
FIGS. 2A, 3A and 4A are enlarged top views of alternative detector stages including various magnetoresistive element designs.
Figure 2B:
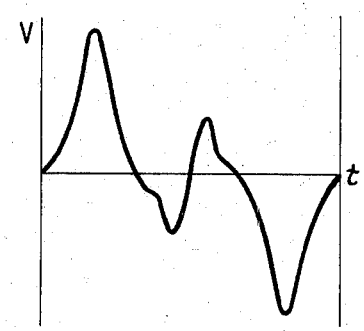
FIGS. 2B, 3B, and 4B are graphs of the outputs associated with the designs of FIGS. 2A, 3A, and 4A, respectively.
Figure 3A:
Figure 3B:
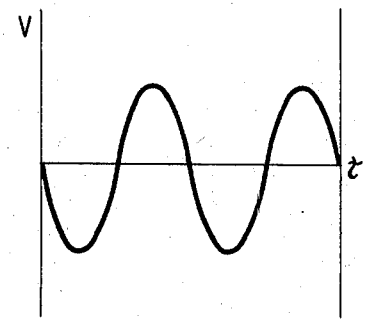

We will direct our attention herein to the geometry of detector 14. The detector includes permalloy chevron-shaped elements interlinked by vertical permalloy members in a manner to permit tailoring of the signal generated by the presence of an expanded bubble at the detector. It has been found that the form of the signal generated by a detector of the type shown in FIG. 1 is dependent on the shape and placement of the various elements of the detector. Thus, for example, a detector with chevron elements linked by first and second sets of interlinking elements at the leading and trailing ends thereof as shown in FIG. 2A exhibits an output shown in FIG. 2B in response to the presence of a bubble. On the other hand, a detector with chevron elements interlinked by third and fourth sets of interlinking elements closer to the apices of the elements as shown in FIG. 3A produces an output shown in FIG. 3B. Note that the peaks in FIG. 3B have relatively uniform amplitude and spacing.

Figure 4A:
Figure 4B:
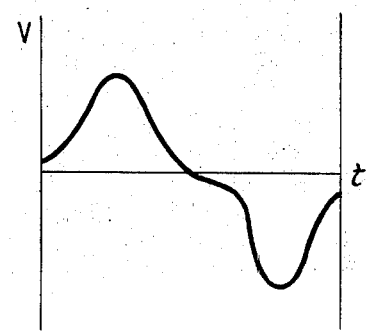

FIG. 4A shows a detector with a combination of first, second, third and fourth sets of interlinking elements as shown in FIGS. 2A and 3A. The corresponding output signal is shown in FIG. 4B. It should be noted that only two peaks occur and the slope of the curve at the crossing is gradual, thus allowing improved phase tolerance during detection. That is to say, a detector strobe pulse applied by source 20 of FIG. 1 can occur over a desirably wide portion of an in-field cycle.

Figure 5:
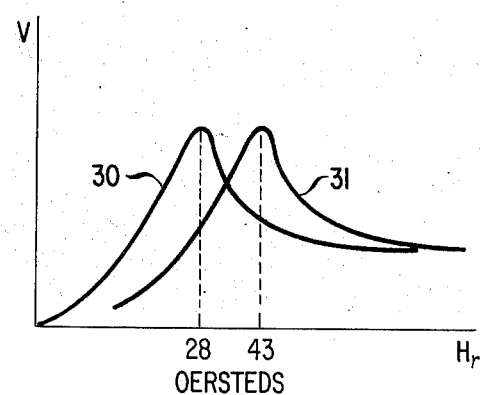
FIG. 5 is a graph of a representative detector output as a function of rotating field amplitude.

It is important also to note that each detector geometry is characterized by a peak output voltage as a function of in-plane field amplitude. Thus, for example, a detector as shown in FIG. 2A and adapted for say, 6 micron bubbles, provides a peak output with an in-plane field of 25 to 30 oersteds. This is illustrated by curve 30 of FIG. 5. On the other hand, a detector of the type shown in FIG. 3A with interlinking elements moved inwardly towards the apices of the chevron elements is characterized by a peak output at 40 to 45 oersteds as shown by curve 31 in FIG. 5. A detector element of the type shown in FIG. 4B thus is characterized by a relatively wide peak in its output. The wider the peak, the greater the yield in production, all other factors being equal. The wide peak characteristic is seen to be particularly attractive when it is recognized that frequently the peak shifts with temperature. A wider peak thus also allows considerable latitude with temperature accordingly.

The interlinking elements normally are placed in gradually closer positions for the few elements adjacent the ends of the magnetoresistive element. The gradually closer positions are shown at the top of FIG. 4A. This positioning is to avoid the generation of spurious bubbles under low bias field conditions and to avoid erratic bubble strip movement.

Of course, each pair of interlinking sets for a magnetoresistive detector characterizes the detector by a "zero" indicative of the presence of the rotating in-plane field. As above, multiple pairs of interlinking elements can be used to characterize a detector by a flat zero signal in the absence of any bridging arrangement characteristic of prior art devices.

What is described is considered merely illustrative of the principle of this invention. Therefore, various embodiments thereof can be devised by those skilled in the art in accordance with those principles within the spirit and scope of the invention as encompassed by the following claims.

What is claimed is:

1. A magnetic bubble memory comprising a layer of material in which magnetic bubbles can be moved, a magnetoresistive detector and means for moving said bubbles to said detector, said detector comprising a plurality of chevron elements, said elements being aligned along an axis transverse to the path of bubble movement, said chevron elements being interconnected by interlinking elements into a single magnetoresistive element, said interlinking elements being arranged in at least first, second, and third groups to link together pairs of adjacent elements in at least three different sets of corresponding positions.

2. A magnetic bubble memory in accordance with claim 1 wherein said interlinking elements are arranged in first, second, third, and fourth sets for determining the shape of the output thereof.

* * * * *